United States Patent [19]
Kobayashi et al.

[11] Patent Number: 6,156,656
[45] Date of Patent: Dec. 5, 2000

[54] PROCESS FOR MANUFACTURING A SEMICONDUCTOR DEVICE

[75] Inventors: Masato Kobayashi, Kawasaki; Takao Kinoshita, Kasaoka, both of Japan

[73] Assignee: Sharp Kabushiki Kaisha, Osaka, Japan

[21] Appl. No.: 09/443,006

[22] Filed: Nov. 18, 1999

[30] Foreign Application Priority Data

Nov. 27, 1998 [JP] Japan .................................. 10-337445

[51] Int. Cl.[7] .......................... H01L 21/4763; H01L 21/44
[52] U.S. Cl. .......................... 438/687; 438/622; 438/637; 438/680; 438/681
[58] Field of Search ..................... 438/681, 680, 438/687, 622, 625, 641, 642, 643, 674, 675, 688, 640, 627, 629, 637, 638, 639, 648, 667, 672, 673; 427/252, 588

[56] References Cited

U.S. PATENT DOCUMENTS

| 4,948,623 | 8/1990 | Beach et al. | 427/586 |
| 5,574,247 | 11/1996 | Nishitani et al. | 118/708 |
| 5,893,752 | 4/1999 | Zhang | 438/687 |
| 6,090,702 | 7/2000 | Okamoto | 438/637 |

OTHER PUBLICATIONS

Awaya et al, "The Characteristics of Blanket Copper CVD Deep Submicron Via Filling", VLSI Technologhy, 1993. Digest of Technical Papers, 1993. Symposium on 1993. pp: 125–126.

Awaya et al, "Carrier–gas effects on characteristics of copper chemical vapor deposition using hexafluoro–acetylacetonate–copper (1) trimethylvinylsilane", *Thin Solid Films,* 262 (1995), pp. 12–19.

*Primary Examiner*—Charles Bowers
*Assistant Examiner*—Thanhha Pham
*Attorney, Agent, or Firm*—Nixon & Vanderhye P.C.

[57] ABSTRACT

A process for manufacturing a semiconductor device having a buried electrically conductive film includes: a first step of, with heating at a first temperature a substrate on which an insulating film having a depression is formed, depositing a first copper film having a sufficient thickness for moderating a step defined by the depression, on a surface of the insulating film by a metal organic chemical vapor deposition method; and a second step of, with heating the substrate at a second temperature higher than the first temperature, depositing a second copper film having a sufficient thickness for filling the depression by a metal organic chemical vapor deposition method, wherein a buried electrically conductive layer composed of the first and second copper films is formed in the depression by the first and second steps.

24 Claims, 2 Drawing Sheets

PROCESS FOR MANUFACTURING A SEMICONDUCTOR DEVICE

CROSS-REFERENCE TO RELATED APPLICATION

This application is related to Japanese application No. HEI 10(1998)-337445 filed on Nov. 11, 1998, whose priority is claimed under 35 USC §119, the disclosure of which is incorporated by reference in its entirety.

BACKGROUND OF THE INVENTION

1. Field of the Invention

The present invention relates to a process for manufacturing a semiconductor device. More particularly, the invention relates to a process for manufacturing a semiconductor device having a buried electrically conductive layer made of copper which has high resistance to electromigration and formed by a metal organic chemical vapor deposition method.

2. Description of Related Arts

In recent years, copper has been attracting attention as a material for wiring layers in semiconductor devices because of its low resistance and high electromigration resistance. As shown in FIG. 3, a wiring layer is formed by forming a trench 5 for wiring (or a contact hole) on an insulating film 2 which has been formed on a semiconductor substrate 1, depositing a thin barrier film 3 to prevent diffusion of copper into the insulating film 2 and the semiconductor substrate 1, and deposing a copper film on the barrier film 3 by a metal organic chemical vapor deposition (MOCVD) method.

Examples of organometallic compounds used in the MOCVD method for forming such copper films are hexafluoro-acetylacetonate copper (I) trimethylsilane and hexafluoro-acetylacetonate copper (I) triethoxyvinylsilane, which are liquid at room temperature and vaporize at 60° C. to 90° C.

The organometallic compound in a liquid state is fed in a vaporization chamber at a controlled flow rate, for example, of 0.1 to 2.0 ml/sec, by means of a liquid pump. The vaporization chamber is maintained at a constant temperature, for example, of 60° C. to 90° C., and the organometallic compound is vaporized in the chamber.

The vaporized organometallic compound is sent to a reaction chamber with a carrier gas, for example, of He or $H_2$ gas at a flow rate of 50 cc/min to 200 cc/min. In the reaction chamber, a semiconductor substrate heated to 180° C. to 250° C. by being placed on a susceptor heated to a fixed temperature by electrical resistance is exposed to the vaporized organometallic compound.

The organometallic compound sent into the reaction chamber is decomposed by thermal energy from the semiconductor substrate. As a result, a copper film of copper atoms deposits on the substrate, while other products than copper atoms which are generated by decomposition are discharged.

The deposition rate of the copper film at this time depends greatly on the temperature of the semiconductor substrate. Within the above-mentioned temperature range, the higher the temperature is, the higher the deposition rate is. However, the higher the temperature is, the more difficult it is to cover a step defined by the trench for wiring. A reference, Thin Solid Films 262(1995), pp. 12–19, describes that the deposition of a copper film at low temperatures results in better step coverage.

However, a problem lies in that, if the temperature of the substrate is set low during the deposition of copper films with a view to improving step coverage, throughput of thin copper film formation does not increase.

On the other hand, if the temperature of the substrate is raised for the purpose of improving the throughput, the step coverage becomes worse. As a result, voids may possibly be formed in the trench for wiring or the contact hole. This gives rise to problems such as increased resistance and adverse effect on reliability of devices. In other words, both the deposition rate of the copper film and the step coverage depend greatly on temperature, and they are in a trade-off relation. Therefore, it has been impossible to realize a good deposition rate and good step coverage at the same time.

Also conventionally, since the semiconductor substrate is heated by being put on the susceptor heated by electrical resistance, it has been difficult to finely adjust the temperature of the substrate and it has taken much time to control the temperature of the substrate.

Furthermore, the copper film may possibly be deposited on other places than the substrate, e.g., on the susceptor.

SUMMARY OF THE INVENTION

The present invention provides a process for manufacturing a semiconductor device having a buried electrically conductive film comprising a first step of, with heating at a first temperature a substrate on which an insulating film having a depression is formed, depositing a first copper film having a sufficient thickness for moderating a step defined by the depression, on a surface of the insulating film by a metal organic chemical vapor deposition method, and a second step of, with heating the substrate at a second temperature higher than the first temperature, depositing a second copper film having a sufficient thickness for filling the depression by a metal organic chemical vapor deposition method, wherein a buried electrically conductive layer composed of the, first and second copper films is formed in the depression by the first and second steps.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention is now described with reference to FIGS. 1(*a*) and 1(*b*).

First, an insulating film 2 is formed on a semiconductor substrate 1. Here the semiconductor substrate and the insulating film are not particularly limited to any type, and any known substrate and insulating film may be used. For example, the substrate may be a substrate of silicon, GaAs or the like. The insulating film may be made of $SiO_2$, SiN or the like, or a laminate thereof. The insulating film may be formed by a thermal oxidation method, a chemical vapor deposition (CVD) method or the like.

Figure 1A:
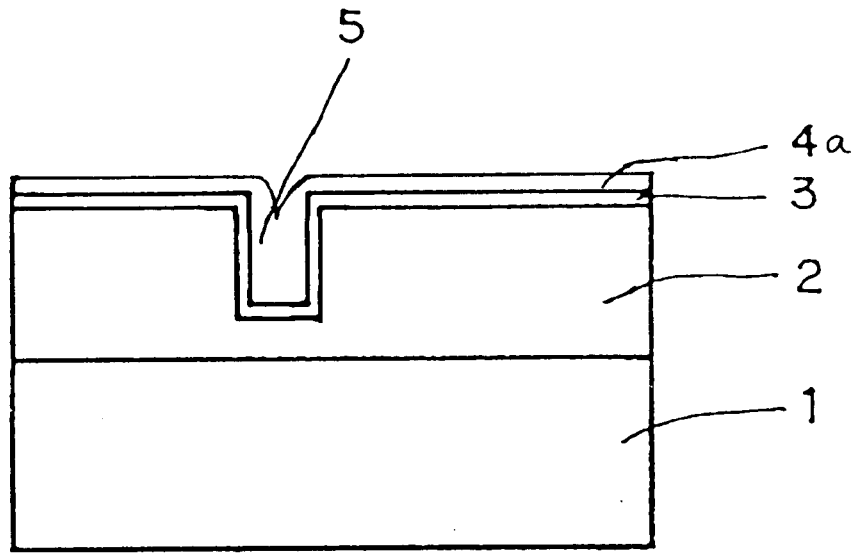
FIGS. 1(*a*) and 1(*b*) are schematic sectional views illustrating a process for manufacturing a semiconductor device in accordance with the present invention.

Next, a depression is formed on the insulating film 2. The depression means a trench for forming a wiring layer (a trench for wiring), a hole for forming a contact plug (a contact hole) or the like. The present invention may be used aptly, especially in the case where the depression has a width of about 5 $\mu$m or less. More preferably, the width is about 1 $\mu$m or less. Preferably, the depth of the depression is about 0.7 $\mu$m. Especially, it is preferred that the present invention is applied to a case where the depression has an aspect ratio of about 5 or more. FIG. 1(a) shows an example where the depression is a trench 5 for wiring. The depression may usually be formed by anisotropic etching such as a reactive ion etching (RIE) method.

Preferably, a barrier film 3 for preventing diffusion of copper into the insulating film is formed on the surface of the insulating film including the depression before the deposition of a first copper film. The barrier film 3 may be formed of TiN, TaN, TaSiN and a laminate thereof, for example. Preferably, the barrier film is about 10 nm to about 100 nm thick. The barrier film may be formed by a sputtering method, a CVD method or the like.

Next, the first copper film is formed on the surface of the insulating film by a metal organic chemical vapor deposition (MOCVD) method with heating the substrate at a first temperature. FIG. 1(a) illustrates a constitution in which the first copper film 4a is deposited on the barrier film 3.

An organometallic compound is used as a starting material for the first copper film in the MOCVD method. As the organometallic compound, it is preferable to use a compound which is liquid at room temperature and has a boiling point of about 60° C. to about 90° C. so that the copper film is formed at a low temperature. Examples of such compounds include hexafluoro-acetylacetonate copper (I) trimethylsilane and hexafluoro-acetylacetonate copper (I) triethoxyvinylsilane.

Figure 2:
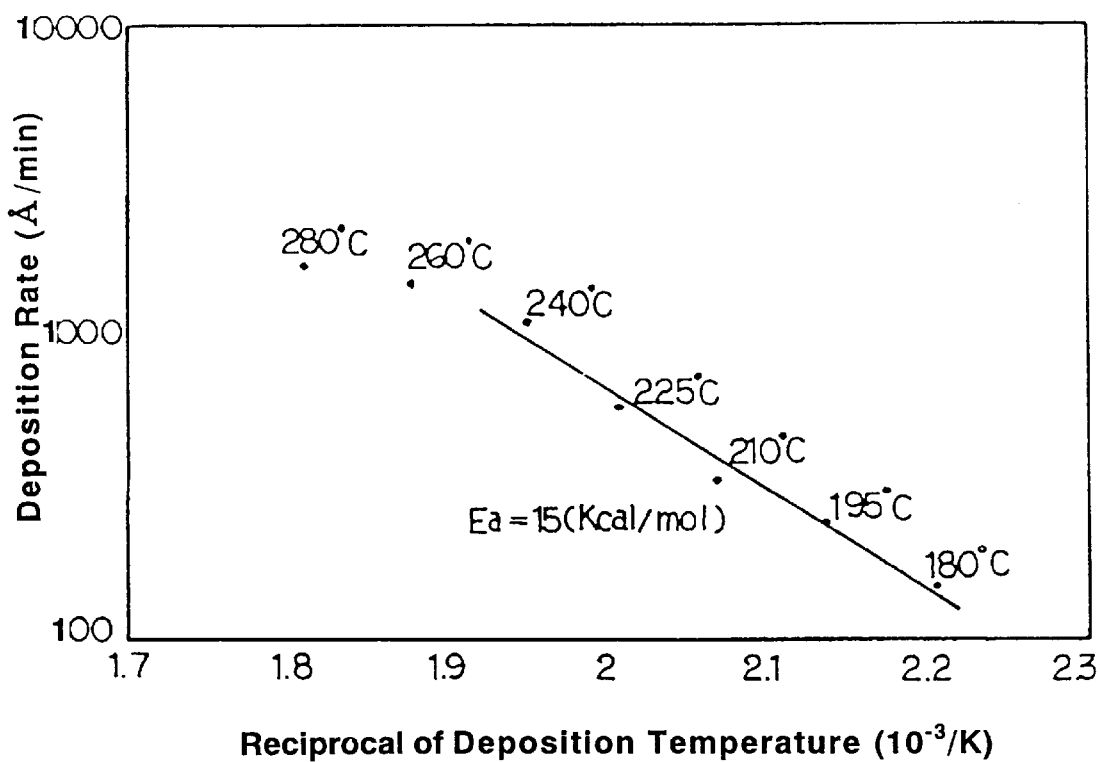
FIG. 2 is graphical representation showing a relationship between the temperature of a substrate and the deposition rate of a copper film in the case where hexafluoro-acetylacetonate copper (I) triethoxyvinylsilane is used as an organometallic compound.
Figure 3:
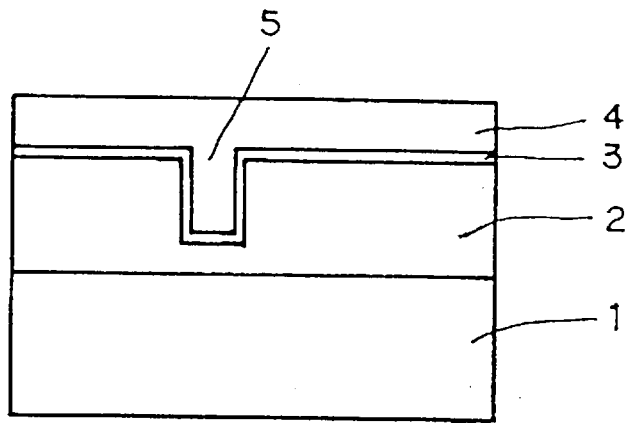
FIG. 3 is a schematic sectional view of a conventional semiconductor device.

The first temperature is set within such a range that a step formed by the depression can be covered well when the first copper film is formed by the decomposition of the organometallic compound. This range for the first temperature varies depending upon what kind of organometallic compound is used. FIG. 2 shows a relationship between the temperature of the substrate and the deposition rate where hexafluoro-acetylacetonate copper (I) triethoxyvinylsilane is used as the organometallic compound to form a copper film by the MOCVD method. In the case of this organometallic compound, it has been verified that the step coverage is good if the first temperature is within the range of about 180° to about 200° C. If the first temperature is lower than about 180° C., the organometallic compound is slow in decomposing and the deposition rate declines significantly, as understood from FIG. 2. Therefore, such temperature is not preferable. If the first temperature is higher than about 200° C., on the other hand, the step coverage becomes worse. Therefore, such temperature is not preferable. Preferably, the deposition rate at the first temperature is within the range of about 2000 Å/min or higher.

For heating the substrate, any heating means may be used provided that the substrate can be heated to the first temperature. Preferable heating means is not the conventional susceptor but heating means using infrared radiation. The use of infrared radiation facilitates the control of temperature. Further, it is preferred to heat only the substrate by the infrared radiation. The heating only of the substrate prevents deposition of copper on other place than the substrate. More particularly, mentioned is means for heating the substrate by irradiating with infrared rays of a surface (hereinafter referred to as a rear surface) of the substrate opposite to the surface on which the insulating film is formed.

Other conditions for forming the copper film than mentioned above may be set as follows: First, the liquid organometallic compound is allowed to flow into a vaporization chamber preferably at a flow rate of about 0.1 ml/sec to about 2 ml/sec. Preferably, the temperature in the vaporization chamber is about 60° C. to about 90° C., though it varies depending upon the kind of the organometallic compound used. Subsequently, the vaporized organometallic compound is allowed to flow into a reaction chamber in which the copper film is deposited on the substrate. At this time, the vaporized organometallic compound is preferably sent to the reaction chamber with a carrier gas, for example of $H_2$, He or the like, at a flow rate of about 50 cc/min to about 200 cc/min. Preferably, the pressure in the reaction chamber is kept constant within the range of about 0.1 mTorr to about 2 mTorr by adjusting a valve between the reaction chamber and a pump.

The first copper film is deposited to have a sufficient thickness for covering the depression. Here, the sufficient thickness is preferably about 20 nm to about 500 nm, though it varies depending upon the shape of the depression.

Through the above-described steps, the construction shown in the FIG. 1(a) is obtained.

Next, the second copper film 4b is deposited to have a sufficient thickness for filling the depression by the MOCVD method with heating the substrate at the second temperature which is higher than the first temperature. At this time, the second temperature may be set to any temperature provided that it is higher than the first temperature. However, if the second temperature is too high, the organometallic compound may undergo an unfavorable decomposition which will lead to deterioration in the quality of the copper film. For this reason, it is preferred that the second temperature is about 10° C. to about 100° C. higher than the first temperature. More particularly, the second temperature is preferably about 210° C. to about 280° C. If the second temperature is lower than about 210° C., the deposition rate is low as shown in FIG. 2 and it takes much time to form the second copper film. Therefore, it is not preferable. The deposition rate at the second temperature is preferably about 300 Å/min or higher, more preferably within the range of about 500 Å/min or higher.

Other conditions for depositing the second copper film than the deposition temperature may be the same as those for depositing the first copperfilm. Preferably, heating to the second temperature is carried out only on the rear surface of the substrate.

Figure 1B:
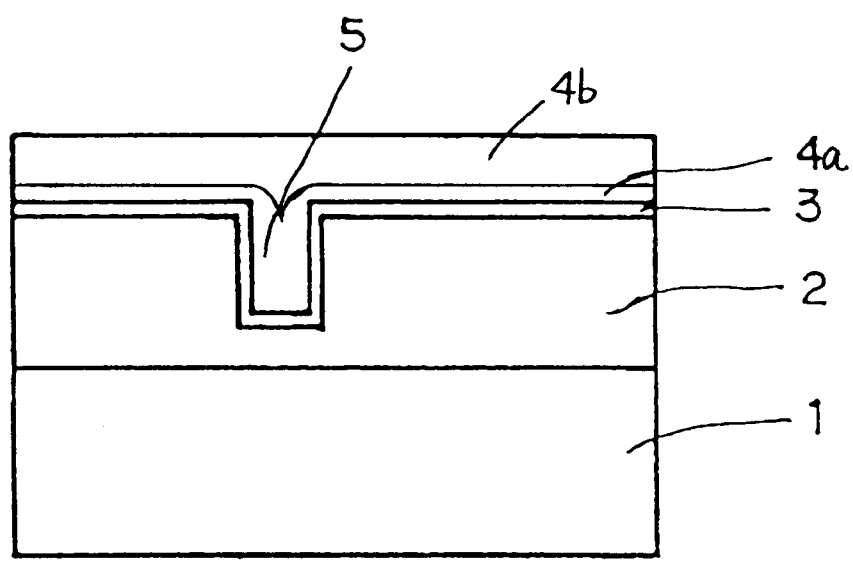

Through the above-described steps, the construction shown in FIG. 1(b) is obtained. The first and second copper films 4a and 4b together form a buried electrically conductive layer.

According to the above-described present invention, it is possible to bury the copper film in the depression such as a trench for wiring, a contact hole or the like without allowing voids to be produced and to realize a high throughput. Consequently, a high industrial productivity can be achieved.

Also, the heating of the substrate by infrared irradiation facilitates the control of temperature.

Further, the heating only of the substrate prevents the copper film from depositing on other places than the substrate.

Furthermore, by setting the first and second temperatures within predetermined ranges, both the step coverage and throughput can be improved.

What is claimed is:

1. A process for manufacturing a semiconductor device having a buried electrically conductive film comprising:

a first step of, with heating at a first temperature a substrate on which an insulating film having a depression has been formed, depositing a first copper film having a sufficient thickness for moderating a step defined by the depression on a surface of the insulating film by a metal organic chemical vapor deposition method; and a second step of, with heating the substrate at a second temperature higher than the first temperature, depositing on the first copper film a second copper film having a sufficient thickness for filling the depression by a metal organic chemical vapor deposition method, wherein a buried electrically conductive layer composed of the first and second copper films is formed in the depression by the first and second steps.

2. A process according to claim 2, wherein the first and second temperatures are controlled by irradiation with infrared rays from a side of the substrate on which the insulating film has not been formed.

3. A process according to claim 2, wherein the irradiation with infrared rays is carried out only on the substrate.

4. A process according to claim 1, wherein the first temperature is within the range from 180° C. to 200° C.

5. A process according to claim 1, wherein the second temperature is within the range from 210° C. to 280° C.

6. A process according to claim 1, wherein the first and second copper films are formed by a metal organic vapor deposition method using, as a starting material, an organometallic compound which is liquid at room temperature and has a boiling point of 60° C. to 90° C.

7. A process according to claim 6, wherein the organometallic compound is hexafluoro-acetylacetonate copper (I) trimethylsilane or hexafluoro-acetylacetonate copper (I) triethoxyvinylsilane.

8. A process according to claim 1, wherein the first copper film has a thickness of 20 nm to 500 nm.

9. A process according to claim 1, wherein the second copper film has a thickness of 300 nm to 700 nm.

10. A process according to claim 1, wherein the depression has a width of 0.5 $\mu$m to 5 $\mu$m.

11. A process according to claim 1, wherein the depression has a depth of 0.5 $\mu$m or more.

12. A process according to claim 1 further comprising the step of forming a barrier film for preventing copper from diffusing into the insulating film on a surface of the insulating film including the depression before the first copper film is formed.

13. A process for manufacturing a semiconductor device having a buried electrically conductive film comprising the steps of:

forming on a substrate an insulating film;

forming a depression in the insulating film;

forming a barrier film on a surface of the insulating film;

heating at a first temperature the substrate and depositing on a surface of the barrier film, by a metal organic chemical vapor deposition method, a first copper film having a sufficient thickness for moderating a step defined by the depression; and heating the substrate at a second temperature higher than the first temperature and depositing on the first copper film, by a metal organic chemical vapor deposition method, a second copper film having a sufficient thickness for filling the depression, wherein a buried electrically conductive layer composed of the first and second copper films is formed in the depression.

14. A process according to claim 1, wherein the second temperature is higher than the first temperature by an amount in the range of 10° C. to 100° C.

15. A process according to claim 13, wherein the first temperature is within the range from 180° C. to 200° C., and wherein the second temperature is within the range from 210° C. to 280° C.

16. A process according to claim 1, wherein the first and second copper films are formed by a metal organic vapor deposition method using, as a starting material, an organometallic compound which is liquid at room temperature and has a boiling point of 60° C. to 90° C.

17. A process according to claim 16, wherein the organometallic compound is hexafluoro-acetylacetonate copper (I) trimethylsilane or hexafluoro-acetylacetonate copper (I) triethoxyvinylsilane.

18. A process according to claim 13, wherein the substrate is formed from silicon or $G_aA_s$.

19. A process according to claim 13, wherein the insulating film is made of $SiO_2$, SiN, or a laminate thereof.

20. A process according to claim 13, wherein the barrier film is formed from TiN, TaN, TaSiN, or a laminate thereof.

21. A process according to claim 16, wherein the liquid organometallic compound flows into a vaporization chamber at a rate of about 0.1 ml/sec to about 2 ml/sec, and the vaporization chamber is maintained at about 60° C. to about 90° C.

22. A process according to claim 21, wherein the vaporized organometallic compound is subsequently sent to a reaction chamber with a carrier gas of $H_2$ or $H_e$ at a flow rate of about 50 cc/min to about 200 cc/min, and wherein the reaction chamber is kept at a pressure of about 0.1 mTorr to about 2 mTorr.

23. A process according to claim 1, wherein the depression has an aspect ratio of greater than or equal to 5.

24. A process according to claim 13, wherein the depression has an aspect ratio of greater than or equal to 5.

* * * * *